United States Patent [19]

Riddle

[11] Patent Number: 5,045,731
[45] Date of Patent: Sep. 3, 1991

[54] ULTRAMINIATURE 180 DEGREE PHASE SHIFTER

[75] Inventor: Alfred N. Riddle, Milpitas, Calif.

[73] Assignee: Avantek, Inc., Milpitas, Calif.

[21] Appl. No.: 427,787

[22] Filed: Oct. 27, 1989

[51] Int. Cl.$^5$ .................. H03L 7/00; H03K 5/159; H01P 3/00

[52] U.S. Cl. .................................. 307/511; 307/513; 328/55; 333/164

[58] Field of Search ............... 307/511, 513, 443, 241, 307/242, 254, 571; 328/155; 333/164

[56] References Cited

U.S. PATENT DOCUMENTS

| | | | |
|---|---|---|---|
| 4,458,219 | 7/1984 | Vorhaus | 333/164 |
| 4,556,808 | 12/1985 | Coats | 333/164 |
| 4,580,114 | 4/1986 | Upadhyayula | 333/100 |
| 4,599,585 | 7/1986 | Vorhaus et al. | 333/164 |
| 4,605,912 | 8/1986 | Naster et al. | 333/164 |
| 4,647,789 | 3/1987 | Upadhyayula | 307/511 |
| 4,733,203 | 3/1988 | Ayasli | 333/164 |
| 4,754,265 | 7/1988 | Henderson et al. | 340/653 |

FOREIGN PATENT DOCUMENTS 1109834  8/1984  U.S.S.R. ............................. 333/164

Primary Examiner—Stanley D. Miller
Assistant Examiner—Trong Phan
Attorney, Agent, or Firm—Philip M. Shaw, Jr.

[57] ABSTRACT

A 180 degree ultraminiature phase shifter. Only two switching devices and very few passive circuit elements are required, thus allowing an extremely small and low loss device to be fabricated. When power is applied to switching devices, a low pass pi section low pass filter is realized which provides +90 degrees of phase shift. When power is absent from the switching devices, a T section high pass filter is realized which provides −90 degrees of phase shift.

5 Claims, 1 Drawing Sheet

ULTRAMINIATURE 180 DEGREE PHASE SHIFTER

BACKGROUND OF THE INVENTION

1. Field of the Invention

The present invention relates to phase shifter circuits and more particularly to switchable high pass/low pass realizations of such circuits.

2. Description of the Prior Art

The design of phase shifters using field effect transistors ("FET") and high pass/low pass filter sections is well known. See, for example, Garver, "Broad-Band Diode Phase Shifters," IEEE Transactions MTT, pp. 314-23 (May 1972). Such devices have particular importance in microwave transmit/receive modules. It is of significant importance to have such devices be as small and low loss as possible. High pass/low pass filters have provided the smallest realization, however current state of the art uses five switching devices in such circuits. Smaller realization would result in smaller die size, reduced losses and higher yields, which in turn results in a lower cost product.

SUMMARY OF THE INVENTION

Disclosed is a high pass/low pass phase shifter circuit which uses only two switching devices. It is therefore an object of the present invention to significantly reduce the number of elements required in order to realize 180 degrees of phase shift.

The foregoing and other objectives, features and advantages will be more readily understood upon consideration of the following detailed description of certain preferred embodiments of the invention, taken in conjunction with the accompanying drawings.

DESCRIPTION OF THE PREFERRED EMBODIMENT

Figure 1:
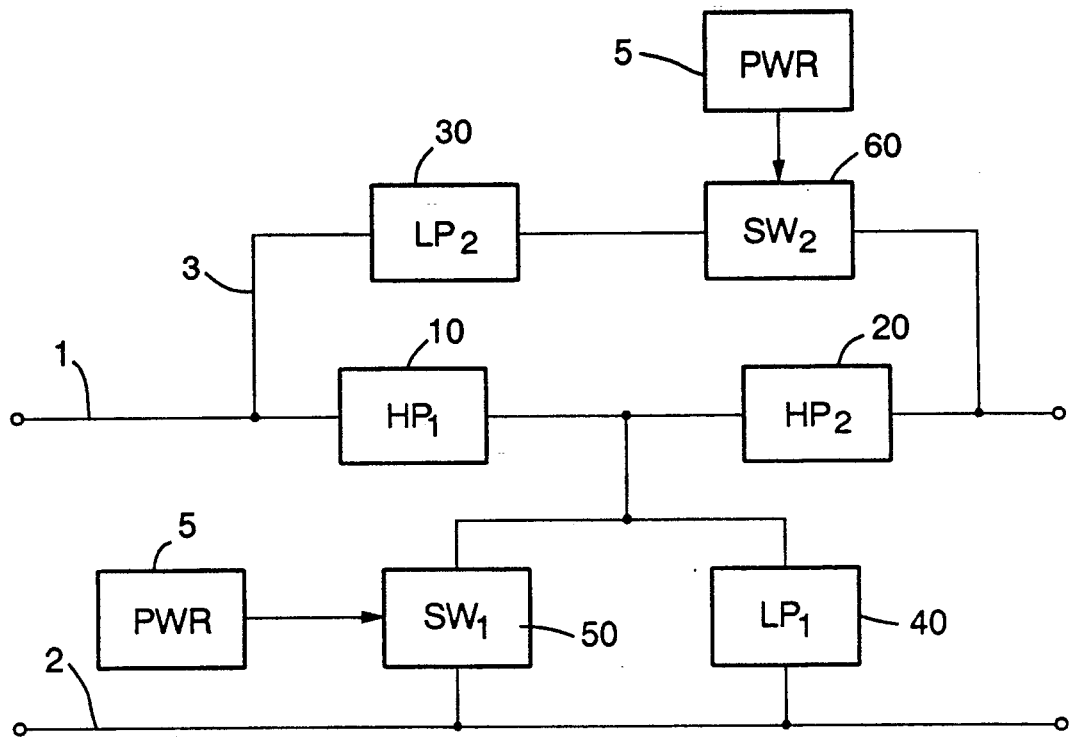
FIG. 1 is a block diagram of the preferred embodiment.

A general block diagram of the invention is shown is FIG. 1. Transmission line 1 contains two capacitive elements in series, 10 and 20. Connected in parallel to line 1 is a branch line 3 which contains an inductive element 30 in series with a switching device 60. A passive power source 5 is connected to the switching device.

Shunting transmission lines 1 and 2 and connected at a point on line 1 between capacitive elements 10 and 20 are two devices which are wired in parallel: a second switching device 50 and a second inductive element 40. Passive power 5 is also applied to the switching device 50.

When power is applied to the switching devices, a pi section low pass filter is realized which shows +90 degrees of phase shift. When power is off, a T section high pass filter is realized which shows −90 degrees of phase shift.

Figure 2:
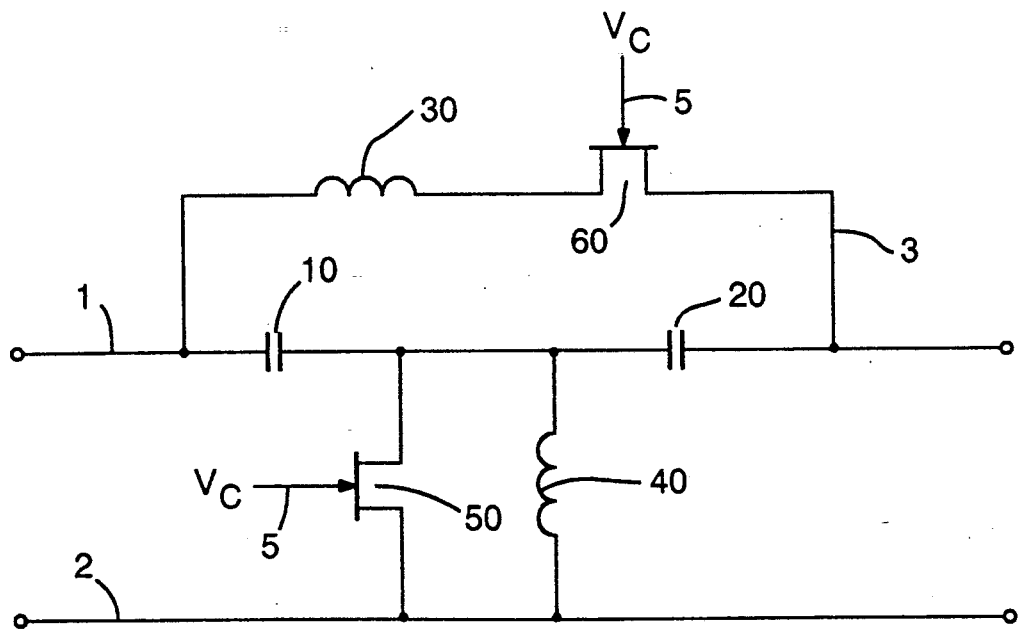
FIG. 2 is a circuit schematic of the preferred embodiment.

A typical circuit diagram is shown in FIG. 2, wherein the switching devices 50 and 60 are shown as field effect transistor (FET) switches. Although the switching devices 50 and 60 are shown as FETs, in other embodiments other electronic switches could be employed, such as diodes which can be selectively reverse biased to be nonconductive.

Although the present invention has been shown and described with respect to preferred embodiments, various changes and modifications which are obvious to a person skilled in the art to which the invention pertains are deemed to lie within the spirit and scope of the invention.

What is claimed is:

1. A phase shifter circuit, comprising:
   (a) a first signal path having a first high pass network and a second high pass network connected in series;
   (b) a second signal path connected in parallel with said first signal path;
   (c) a first switching device which is connected from a point between said first and second high pass networks of said first signal path and said second signal path;
   (d) a first low pass network which is connected in parallel with said first switching device;
   (e) a branch line which is connected in parallel with said first signal path and having a second low pass network in series with a second switching device;
   (f) means for selectively actuating said first and second switching devices.

2. A phase shifter as recited in claim 1, wherein said means for selectively actuating said first and second switching devices actuates them simultaneously, whereby +90 degrees of phase shift is realized in one mode of operation and −90 degrees of phase shift is realized in the other mode of operation.

3. A phase shifter as recited in claim 1, wherein said first high pass network comprises a first capacitor and said second high pass network comprises a second capacitor.

4. A phase shifter as recited in claim 1, wherein said first low pass network comprises a first inductor and said second low pass network comprises a second inductor.

5. A phase shifter as recited in claim 1, wherein said first switching device comprises a first field effect transistor and said second switching device comprises a second field effect transistor.

* * * * *